United States Patent
Pezzani

[11] Patent Number: 5,889,374
[45] Date of Patent: Mar. 30, 1999

[54] THYRISTOR CONTROL SWITCH FOR A BIDIRECTIONAL MOTOR

[75] Inventor: Robert Pezzani, Vouvray, France

[73] Assignee: SGS-Thomson Microelectronics S.A., Saint Genis, France

[21] Appl. No.: 801,482

[22] Filed: Feb. 18, 1997

[30] Foreign Application Priority Data

Feb. 27, 1996 [FR] France .................................. 96 02700

[51] Int. Cl.⁶ .................................................. H02P 7/00
[52] U.S. Cl. ........................................ 318/254; 318/439
[58] Field of Search ................... 318/254, 439, 318/138

[56] References Cited

U.S. PATENT DOCUMENTS

| | | | |
|---|---|---|---|
| 3,214,667 | 10/1965 | Foster et al. | 318/434 |
| 3,694,715 | 9/1972 | Linde et al. | 318/139 |
| 3,754,177 | 8/1973 | O'Reilly | 318/480 |
| 3,857,076 | 12/1974 | Hetland | 318/257 |
| 4,139,808 | 2/1979 | Matsumura | 318/269 |
| 4,158,796 | 6/1979 | Kosak et al. | 318/245 |
| 4,181,876 | 1/1980 | Kato et al. | 318/246 |
| 4,358,718 | 11/1982 | Delomez . | |
| 4,394,606 | 7/1983 | Woerwag | 318/434 |
| 4,433,276 | 2/1984 | Nola | 318/729 |
| 4,491,197 | 1/1985 | Nishiwaki | 187/296 |
| 4,575,662 | 3/1986 | Lehnhoff | 318/282 |
| 4,710,685 | 12/1987 | Lehnhoff et al. | 318/287 |
| 4,912,390 | 3/1990 | Curran Jr. et al. | 318/812 |
| 4,937,470 | 6/1990 | Zeiler | 327/109 |
| 5,023,529 | 6/1991 | Tennant | 318/266 |
| 5,420,046 | 5/1995 | Akiyama et al. | 438/140 |

FOREIGN PATENT DOCUMENTS

A-0 007 622  2/1980  European Pat. Off. .

OTHER PUBLICATIONS

Patent Abstracts of Japan, vol. 8, No. 99 (E–243), May 10, 1984 & JP–A–59 017867 (Nippon Denso KK).

*Primary Examiner*—Jonathan Wysocki
*Attorney, Agent, or Firm*—Wolf, Greenfield & Sacks, P.C.

[57] ABSTRACT

An on/off switching component of a motor powered according to a first or a second polarity, connected in series with the motor. The switching component includes two head-to-tail connected cathode gate thyristors, and two diodes of same polarity. The two diodes have first same polarity terminals respectively connected to the gate of a respective one of the two cathode gate thyristors and second terminals connected together to a control terminal.

18 Claims, 4 Drawing Sheets

THYRISTOR CONTROL SWITCH FOR A BIDIRECTIONAL MOTOR

BACKGROUND OF THE INVENTION

1. Field of the Invention

The present invention relates to a on/off control switch of a bi-directional motor.

2. Discussion of the Related Art

In many systems, for example in a car, a large number of motors are provided, each of which can be supplied with a dc. current having one polarity or the other to rotate according to one direction or the other. This is, for example, the case of the car window risers, all the motors of which are connected to the battery through an inverting element for connecting each motor according to one polarity or the other, a switch being associated with each motor to allow the powering of a single motor or of a plurality of motors simultaneously. Similar systems are provided for the locking of the doors or other locks in a car, for example the gas cap lock, for rear view mirror controlling devices, and so on . . . . Although the above examples are given in the case of a car, similar problems arise in other technological fields.

FIG. 1 is a simplified schematic diagram illustrating the aimed device. This device includes a plurality of motors M1, M2, M3 . . . respectively connected by a first terminal 11, 12, 13 . . . to the respective first terminals of respective switches S1, S2, S3 . . . . The second terminals 21 of the motors are common and connected to the common terminal of a first inverting element I1. The second terminals of the switches S1, S2, S3 are common and connected to the common terminal 31 of an inverting element I2. The inverting elements I1 and I2 can provide respective connections to a supply voltage, for example, a battery voltage, and to ground G, and the other way round. Thus, a current may flow in each motor according to one polarity or the other according to the positioning of the inverting arrangement I1–I2. Once the polarity of the current liable to flow in the motors is selected, one or a plurality of motors are powered depending upon whether one or a plurality of switches S1, S2, S3 are on. Thus, an individual control or a grouped control of the car windows, for example, can be achieved.

Conventionally, switches S1, S2, S3 are electromechanical switches. If it is desired to replace these electromechanical switches by static components, a first possibility is to use triacs TR1, TR2, TR3 . . . , as represented in FIG. 2, since the switches have to conduct a current in one direction or the other.

A first drawback to the use of triacs is presented by their control, because the common terminal 31 is either grounded or connected to voltage Vcc. For example, if it is desired to control the triacs through a microcontroller μC connected between voltage Vcc and ground, the microcontroller will provide control signals referenced to ground. When common terminal 31 is grounded, the microcontroller can control a desired triac without problems. However, when terminal 31 is connected to voltage Vcc, a problem arises because the control signal cannot flow simply between the output of the microcontroller, which is near the ground voltage, and terminal 31, which is near voltage Vcc. A solution to this problem requires the provision, between the microcontroller output and the gates of the triacs, of a circuit or components allowing adjustment of the control signal.

FIG. 2 illustrates a possible structure of a passive adjustment circuit including three resistors and a capacitor for each triac based switch. The capacitor ensures an insulation between the voltage at terminal 31 and the microcontroller while allowing the transmission of pulse control signals. Other circuits based on active components (bipolar transistors) could also be provided. However, in all cases, the control of the switches is not direct and requires an interface to adjust the voltage of terminal 31.

A second drawback to the use of triacs is that they require a relatively high gate current and cannot, for example, be directly controlled by the outputs of a logic circuit or controller. A third drawback is that the various triacs TR1, TR2, TR3 . . . are necessarily realized on separate silicon chips because, at present, no means exists to integrate on the same chip triacs having a first common electrode, the common electrode being the electrode to which the gate is referenced.

SUMMARY OF THE INVENTION

An object of the present invention is to provide a switch that allows bi-directional current flow with a single control actuable by logic signals.

A further object of the present invention is to provide such a switching component where the logic signals that control the switching component can be provided by an integrated circuit powered directly from a battery which also powers the circuits on which the switch acts, without it being necessary to provide an adjustment or interface circuit.

A further object of the present invention is to provide such a component which is monolithically realized on a semiconductor chip.

A further object of the present invention is to provide such a component which is realized on a single semiconductor chip in association with other identical components having a common terminal therewith.

To achieve this object, an embodiment of the present invention provides an on/off switching component of a motor powered according to a first or a second polarity, connected in series with the motor, the switching component including two head-to-tail connected cathode gate thyristors, and two diodes of same polarity, having first same polarity terminals respectively connected to the gates, and second terminals connected together to a control terminal.

An embodiment of the present invention also provides an on/off control system for a set of motors, each motor being respectively connected in series by a first terminal of the respective motor to a first terminal of a respective switching component, the second terminal of each respective switching component and the second terminal of each respective motor each being connectable to a first terminal or a second terminal of a power supply, each control terminal of a switching component being connected to a respective logic output of a controller.

According to another embodiment of the present invention, the switching component is realized monolithically and the two thyristors are realized vertically in a well of a semiconductor wafer having a first conductivity type, limited by an insulating wall of the second conductivity type, the cathode of the first thyristor being on the upper side of the well, the cathode of the second thyristor being on the lower side of the well, the cathode gate region of the second thyristor being connected to the upper side through the insulating wall.

According to a further embodiment of the present invention, the switching component is realized monolithically and includes, in a well of a semiconductor wafer of a first conductivity type, limited by an insulating wall of a second conductivity type: at the upper surface, first, second and third regions of the second conductivity type; at the bottom surface, a layer of the second conductivity type; fourth, fifth and sixth regions of the first conductivity type formed respectively in the first, second and third regions; a seventh region of the first conductivity type, formed in the bottom surface layer and located facing the portion of the first region devoid of the fourth region; an eighth region of the first conductivity type extending the seventh region up to the portion located facing the insulating wall; a first metallization coating the bottom surface; a second metallization coating the first and fourth regions; a third metallization coating the second and third regions; a fourth metallization connecting the fifth region to the upper surface of the insulating wall; and a fifth metallization coating the first and sixth regions.

According to an embodiment of the present invention, the monolithic component includes a plurality of identical structures located inside insulated wells to define a plurality of switching components having a common main terminal.

According to an embodiment of the present invention, the second and third regions are less doped than the first region.

BRIEF DESCRIPTION OF THE DRAWINGS

The foregoing and other objects, features, aspects and advantages of the invention will become apparent from the following detailed description of preferred, non-limiting, embodiments of the present invention described by way of example with reference to the accompanying drawings, in which.

DETAILED DESCRIPTION

Figure 5:
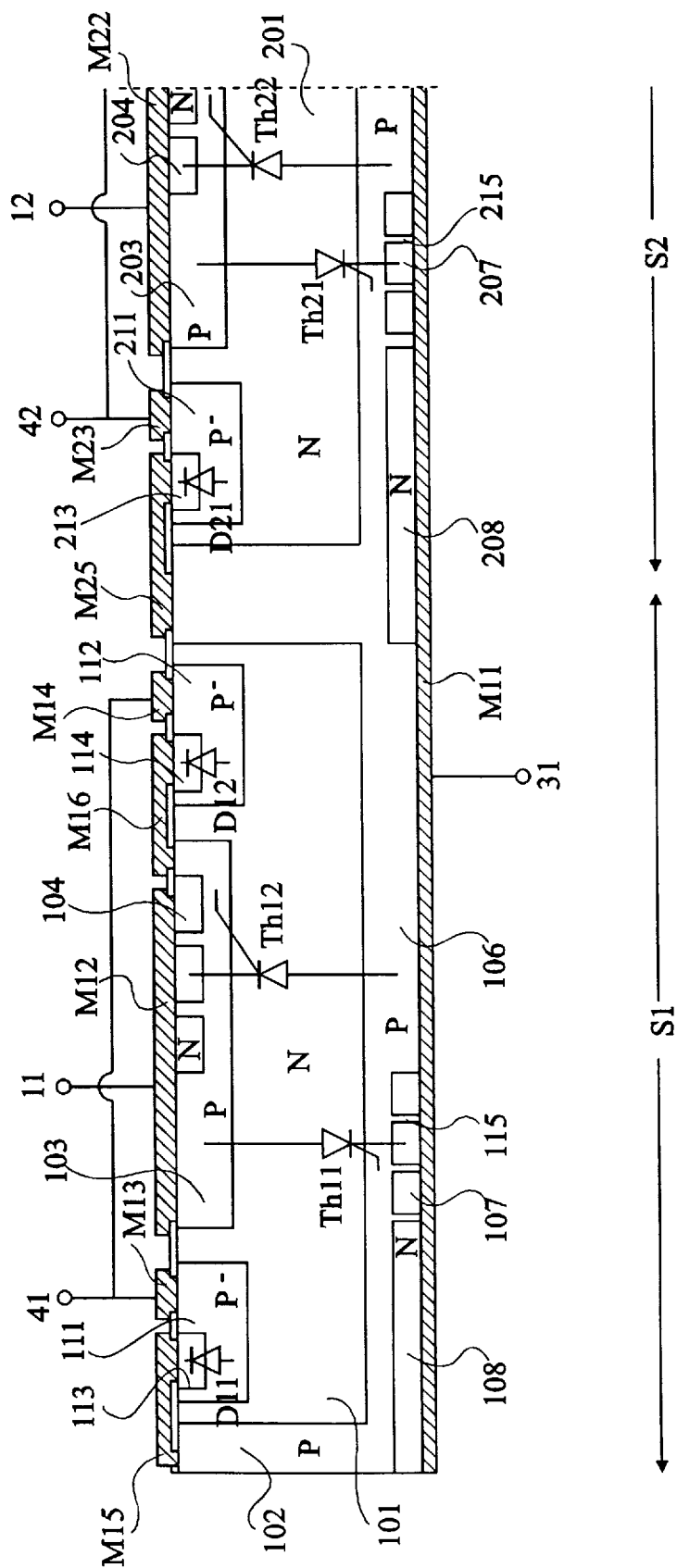
FIG. 5 shows a cross-sectional view of an exemplary monolithic realization of a component according to an embodiment of the present invention.
Figure 6:
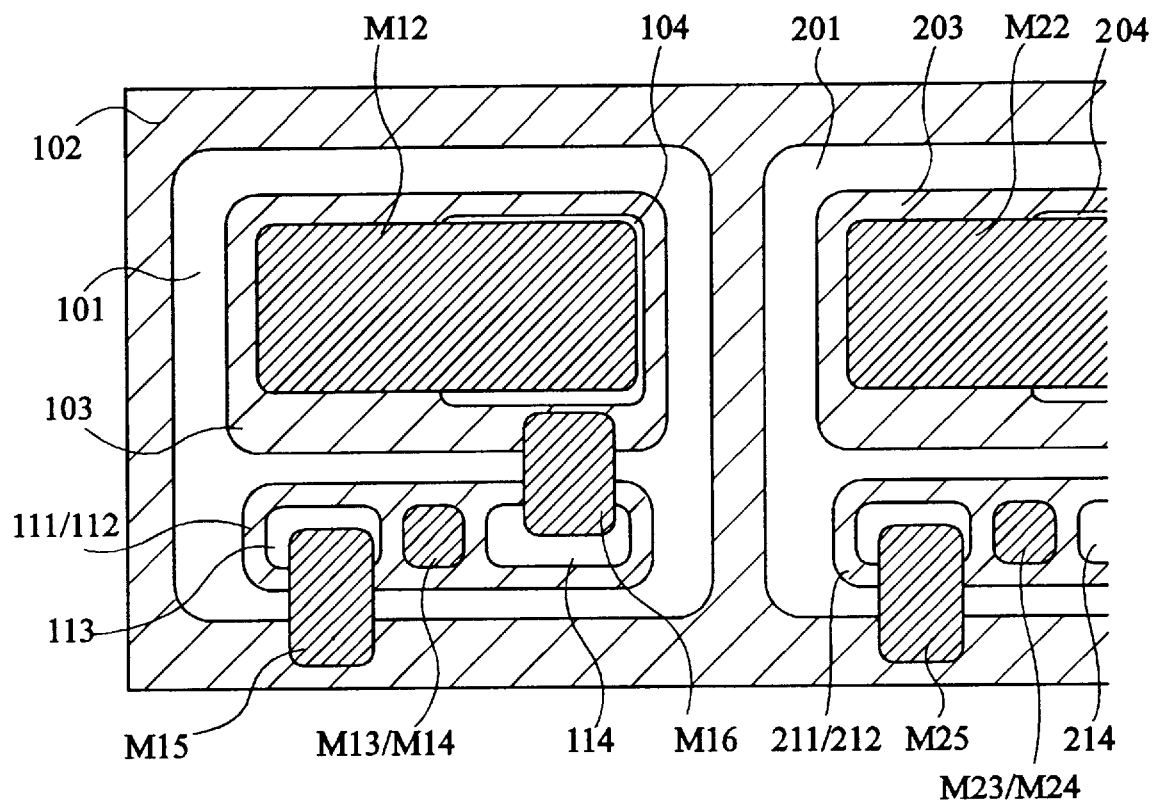
FIG. 6 shows an exemplary top view of the component of FIG. 5.

It should be noted that the cross-sectional view of FIG. 5 and the top view of FIG. 6 are very schematic and that, as usual in the field of semiconductor components, the figures are not drawn to scale; the various sizes either vertically or horizontally are drawn to simplify and increase the intelligibility of the drawings.

Figure 1:
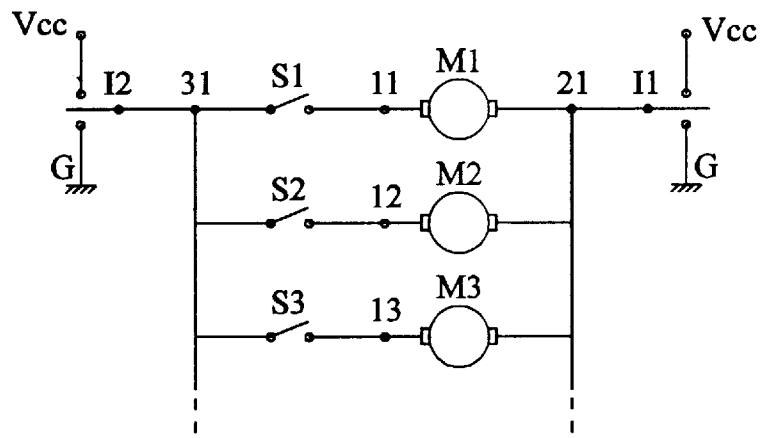
FIG. 1 is a simplified schematic diagram illustrating on/off control switches for bi-directional motors.
Figure 2:
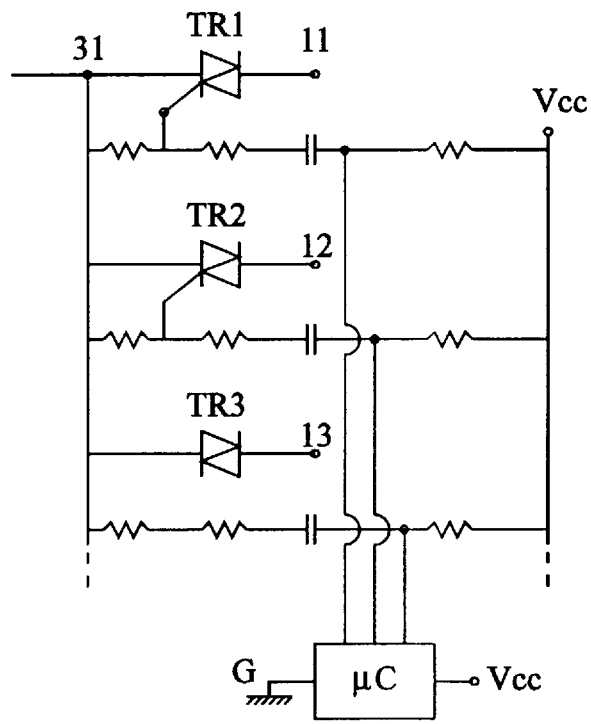
FIG. 2 shows a possible implementation of on/off control switches using triacs.
Figure 3:
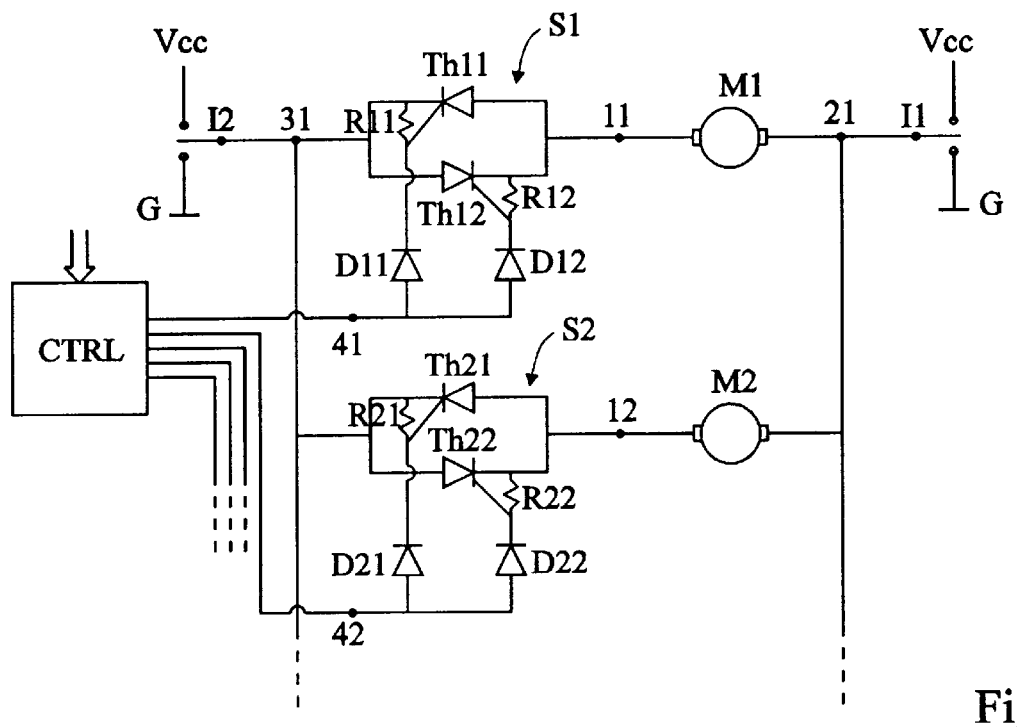
FIG. 3 shows a on/off switching system of motors using a circuit according to an embodiment of the present invention.

FIG. 3 is similar to FIG. 1 and shows in more detail an embodiment of switches S. Only two switches S1 and S2 are shown. Switch S1 includes, between terminals 11 and 31, two head-to-tail connected cathode gate thyristors Th11 and Th12. The gate of Th11 is connected to a control terminal 41 through a diode D11. The gate of thyristor Th12 is connected to the same control terminal through a diode D12. The anodes of diodes D11 and D12 are connected to terminal 41. Switch S2 similarly includes thyristors Th21 and Th22 and diodes D21, D22 whose anodes are connected to a control terminal 42.

Each thyristor Th11, Th12, Th21, Th22 is associated with a gate-cathode resistor R11, R12, R21, R22, respectively, corresponding to the gate-cathode short-circuits of the thyristors.

Terminals 41, 42 . . . of each switch S1, S2 . . . are connected to the outputs of a control circuit CTRL providing suitable on/off control data for motors M1, M2 . . . . According to one aspect of the invention, the control circuit CTRL is preferably a microcontroller providing logic signals and its outputs are directly connected, without intermediate buffers, to control terminals 41, 42 . . . .

Figure 4A:
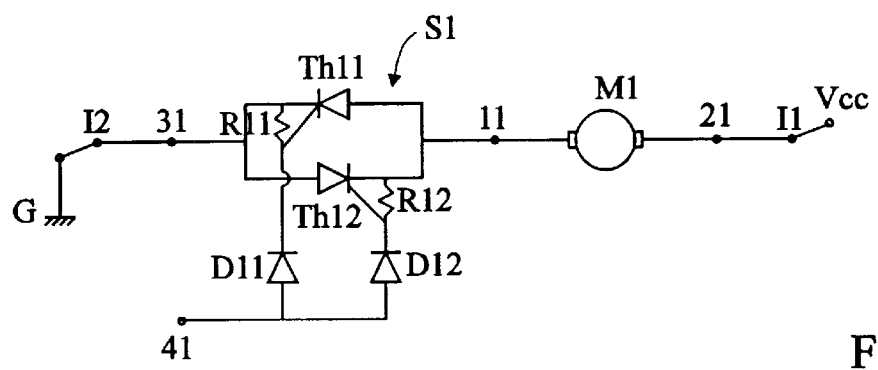
FIGS. 4A and 4B show a same portion of the circuit of FIG. 3 according to two polarizing modes.
Figure 4B:
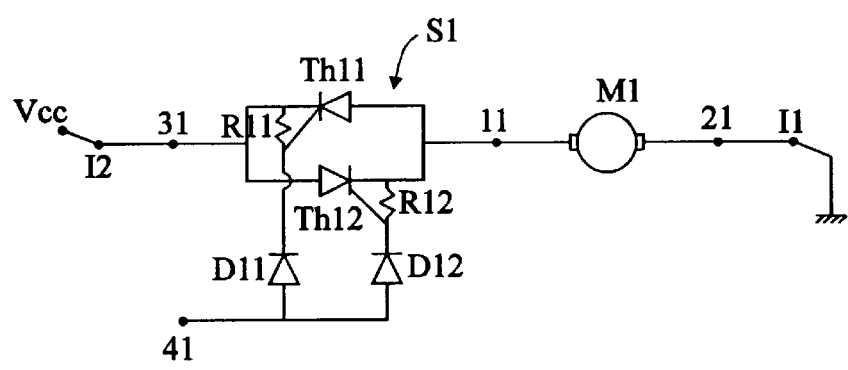

FIGS. 4A and 4B illustrate the operation of the circuit for the branch associated with motor M1. In FIG. 4A it is assumed that the inverting element I1 is connected to the battery voltage Vcc and that the inverting element I2 is grounded. Thus, switch S1 has to be either off to avoid any flow of current in motor M1 or on to allow the flow of a current in motor M1 from terminal 21 to terminal 11. To control this switch, a positive pulse is applied to the control terminal 41. As a consequence, a gate current normally flows from gate terminal of thyristor Th11 to terminal 31 and ground. When it is desired to end the powering of motor M1, inverters I1–I2 are switched off.

Diode D12 has the role of avoiding any voltage return to terminal 41 before the desired turn-on time of thyristor Th11, due to a possible breakdown of the gate-cathode junction of thyristor Th12. Diode D12 should have a sufficient breakdown voltage to withstand any possible voltage surge present in the circuit. In addition, if diode D12 and diode D11 are not present, spurious paths for triggering thyristors Th11 and Th12 could be created.

FIG. 4B shows the configuration in which terminal 31 is connected to terminal Vcc and terminal 21 is grounded. In this case, the provision of a positive pulse to terminal 41 causes the flow of a gate current in thyristor Th12. The current returns to ground by crossing motor M1. This is possible because, at the moment when thyristor Th12 is controlled to switch-on, motor M1 is not operating and therefore has a very low resistive impedance. As soon as motor M1 rotates, a back-electromotive force appears on terminal 11, but thyristor Th12, which has initially been turned on, remains on as long as the current flowing through it is not canceled by switching-off inverters I1–I2. In this case again, diode D11 must be designed to withstand the reverse voltage applied to it. Indeed, the gate-cathode junction of thyristor Th11 is generally not liable to withstand a high reverse voltage.

It should be noted that turning on thyristor Th12 in the configuration of FIG. 4B constitutes an unusual control mode of a thyristor, the gate current being forced to flow through the load, which is possible in the considered application as explained above.

It should be noted that the gate signal for triggering the suitable thyristor Th11 or Th12 always has the same positive direction. This allows a direct control by the controller which will provide an identical output signal independent of the polarity of terminal 31 i.e. independent of whether terminal 31 is connected to Vcc or to ground). One thus obtains an on/off bi-directional switch controllable through a single control terminal that can receive a logic signal of low power as regards the usual sensitivity of thyristors.

FIG. 5 illustrates a monolithic realization of a single control bi-directional switch component according to an embodiment of the present invention, and also shows that a plurality of identical components having a common terminal can be integrated on a single semiconductor chip.

In FIG. 5, the terminals of the component are indicated by using the references 11, 12, 31, 41 and 42 of FIG. 3. Switch S1 is realized in a portion 101 of an N-type substrate surrounded by a P-type insulating wall 102 formed, for example, by deep diffusions from the upper and lower surfaces of the substrate. In the upper surface of the substrate is formed a P-type well 103. In substantially half of the surface of this well is formed an N-type region 104. On the lower surface of the component is formed a uniform P-type layer 106. An N-type region 107 is formed in region 106 substantially facing the portion of region 103 devoid of the N-type region 104.

The bottom surface of the substrate is coated with a metallization M11 and regions 103 and 104 on the upper surface are coated with a metallization M12. Metallization M11 is connected to terminal 31 and metallization M12 is connected to terminal 11. Thus, as illustrated in FIG. 5, two thyristors Th11 and Th12 connected head-to-tail between metallizations M11 and M12 are obtained. Thyristor Th11 includes, from its anode to its cathode, regions 103, 101, 106 and 107, and thyristor Th12 includes, from its anode to its cathode, regions 106, 101 103 and 104. The cathode regions 104 and 107 of thyristors Th11 and Th12 are conventionally provided with emitter shorts 115.

In addition, in the upper portion of region 101 are formed P-type low doped regions 111 and 112 including N-type regions 113 and 114, respectively. Region 111 is coated with a metallization M13 and region 112 is coated with a metallization M14. Metallizations M13 and M14 are connected to terminal 41. Region 113 is coated with a metallization M15 which also coats the upper surface of insulating wall 102. Region 114 is coated with a metallization M16 which also contacts a portion of the upper surface of well 103 near region 104. Thus, the junction between regions 111 and 113 corresponds to diode D11 and the junction between regions 112 and 114 corresponds to diode D12. Diode D12 is directly connected in series between control terminal 41 and the cathode gate region of thyristor Th12. Diode D11 is connected in series between control terminal 41 and the cathode gate region of thyristor Th11 through a vertical path corresponding to the insulation wall 102 and a lateral path corresponding to a region of the P-type layer 106 which is above an N-type region 108 which extends to N-type region 107.

Symbol $P^-$ designates regions 111 and 112 while symbol P designates well 103. This is intended to illustrate the fact that, preferably, regions 111 and 112 are less doped than region 103. Indeed, diodes D11 and D12 should have a sufficient break-over voltage to avoid a breakdown of the gate junctions of the thyristors. In the particular case where the invention applies to a car component and where the voltage is only 12 volts, it is possible to select for region 103 a doping level identical to that of regions 111 and 112.

Similarly, another identical switch could be formed, corresponding, for example, to switch S2 of FIG. 3, in well 201 surrounded by an insulating wall. This is partially represented in the right portion of FIG. 5 where elements of switch S2 identical to those of switch S1 are designated with similar reference designators beginning with the number 2 instead of the number 1 for the semi-conductor regions and for the metallizations, the bottom surface metallization M11 being a common metallization.

FIG. 6 represents an exemplary top-view of the component of FIG. 5. In this example, regions 111 and 112 correspond to a single region and metallizations M13 and M14 correspond to a same and single metallization. Similarly, other alternative implementations will occur to those skilled in the art within the scope of the appended claims.

By way of example, for a component powered by a 12-volt battery, it is possible to select for the various regions the following surface concentrations (Cs in atoms per cm$^2$) and junction depths (xj in micrometers):

| Region | Cs | xj |
|---|---|---|
| layer 101 | $5.10^{13}$ to $10^{15}$ | |
| layers 103 and 106 | some $10^{18}$ | 20 to 40 |
| layers 111 and 112 | some $10^{17}$ | 30 to 50 |
| layers 104, 113, 114 | some $10^{19}$ | 5 to 20 |

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A bidirectional on/off switching component of a motor powered according to a first or a second polarity, the switching component being connected in series with the motor and having a control terminal, comprising:

two head-to-tail connected cathode gate thyristors; and two diodes of same polarity, having first same polarity terminals respectively connected to a gate of a respective one of the two thyristors, and having second terminals connected together, the connected second terminals being coupled to the control terminal of the switching component.

2. The switching component according to claim 1, realized monolithically, wherein:

the two thyristors are realized vertically in a well of a semi-conductor wafer having a first conductivity type, the well being limited by an insulating wall of the second conductivity type, a cathode of a first thyristor being on an upper side of the well, a cathode of a second thyristor being on a lower side of the well, and a cathode gate region of the second thyristor being connected to the upper side through the insulating wall.

3. The switching component according to claim 1, realized monolithically and including, in a well of a semiconductor wafer of a first conductivity type, the well limited by an insulating wall of a second conductivity type:

first, second, and third regions of the second conductivity type at an upper surface of the well;

a layer of the second conductivity type at a bottom surface of the well;

fourth, fifth, and sixth regions of the first conductivity type formed in the first, second, and third regions, respectively;

a seventh region of the first conductivity type, formed in a bottom surface of the layer of the second conductivity type and located facing a portion of the first region devoid of the fourth region;

an eighth region of the first conductivity type extending the seventh region to a location that faces the insulating wall;

a first metallization coating a bottom surface of the semiconductor wafer;

a second metallization coating the first and fourth regions;

a third metallization coating the second and third regions;

a fourth metallization connecting the fifth region to an upper surface of the insulating wall; and a fifth metallization coating the first and sixth regions.

4. The switching component according to claim 3, further including a plurality of identical structures located inside insulated wells to define a plurality of switching components having a common main terminal.

5. The switching component according to claim 3, wherein the second and third regions are less doped than the first region.

6. A bidirectional on/off control system of a set of motors, each motor of the set of motors having a first terminal and a second terminal, the first terminal of each respective motor being connected in series to a first terminal of a respective switching component, the second terminal of each respective motor and a second terminal of each respective switching component being respectively connectable to a first terminal and a second terminal of a power supply, each respective switching component having a control terminal being connected to a logic output of a controller, wherein each respective switching component comprises:

two head-to-tail connected cathode gate thyristors; and two diodes of same polarity, having first same polarity terminals respectively connected to a gate of a respective one of the two thyristors, and having second terminals connected together, the connected second terminals being coupled to the control terminal of the respective switching component.

7. A bidirectional switch for controlling a motor, comprising:

a first switch terminal;

a second switch terminal for coupling the bidirectional switch to the motor;

a control terminal;

a first cathode gate thyristor having a cathode, an anode, and a gate, the cathode of the first thyristor being coupled to the first switch terminal, the anode of the first thyristor being coupled to the second switch terminal, and the gate of the first thyristor being coupled to the control terminal;

a second cathode gate thyristor having a cathode, an anode, and a gate, the cathode of the second thyristor being coupled to the anode of the first thyristor, the anode of the second thyristor being coupled to the cathode of the first thyristor, and the gate of the second thyristor being coupled to the control terminal;

a first diode coupling the gate of the first thyristor to the control terminal, the first diode having an anode that is connected to the control terminal and a cathode that is connected to the gate of the first thyristor; and a second diode coupling the gate of the second thyristor to the control terminal, the second diode having an anode that is connected to the control terminal and a cathode that is connected to the gate of the second thyristor.

8. The bidirectional switch of claim 7, further comprising:

a first resistor connected between the cathode and the gate of the first thyristor; and a second resistor connected between the cathode and the gate of the second thyristor.

9. The bidirectional switch of claim 7, wherein the first and second thyristors and the first and second diodes are formed in a single monolithic component.

10. The bidirectional switch of claim 9, wherein the single monolithic component includes:

a substrate of a first conductivity type surrounded by an insulating wall of a second conductivity type, the second conductivity type being opposite from the first conductivity type;

a layer of the second conductivity type formed in a lower surface of the substrate;

first, second, and third regions of the second conductivity type formed in an upper surface of the substrate;

fourth, fifth, and sixth regions of the first conductivity type formed in the first, second, and third regions, respectively;

a seventh region of the first conductivity type formed in the layer of the second conductivity type and substantially facing a portion of the first region that is devoid of the fourth region; and an eighth region of the first conductivity type formed in the layer of the second conductivity type adjacent to the seventh region that extends to confront the insulating wall.

11. The bidirectional switch of claim 10, further comprising:

a first metallization layer coating bottom surfaces of the layer of the second conductivity type, the seventh region, and the eighth region, the first metallization layer forming the first terminal of the bidirectional switch;

a second metallization layer coating upper surfaces of the first and fourth regions, the second metallization layer forming the second terminal of the bidirectional switch; and a third metallization layer coating upper surfaces of portions of the second and third regions that are devoid of the fifth and sixth regions, respectively, the third metallization layer forming the control terminal of the bidirectional switch.

12. The bidirectional switch of claim 10, wherein the fourth and seventh regions include emitter shorts.

13. The bidirectional switch of claim 10, wherein the second and third regions have a lower doping of the second conductivity type than the first region.

14. A bidirectional switch for controlling a motor, comprising:

a first terminal connected to the motor to receive one of a supply voltage and a reference voltage;

a second terminal connected to the other of the supply voltage and the reference voltage;

a control terminal to receive a logic signal level pulse having a single direction;

first solid state means, connected to the first terminal, the second terminal, and the control terminal, for continuously conducting current from the first terminal to the second terminal in direct response to the logic signal level pulse when the first terminal receives the supply voltage and the second terminal receives the reference voltage;

second solid state means, connected to the first terminal, the second terminal, and the control terminal, for continuously conducting current from the second terminal to the first terminal in direct response to the logic signal level pulse when the first terminal receives the reference voltage and the second terminal receives the supply voltage;

third means, connecting the first solid state means to the control terminal, for preventing spurious triggering of the first solid state means; and fourth means, connecting the second solid state means to the control terminal, for preventing spurious triggering of the second solid state means.

15. The bidirectional switch of claim 14, wherein the first and second solid state means are integrated in a single monolithic device.

16. The bidirectional switch of claim 14, wherein:

the third means further prevents the logic signal pulse from returning to the control terminal prior to the second solid state means conducting current; and the fourth means further prevents the logic signal pulse from returning to the control terminal prior to the first solid state means conducting current.

17. The bidirectional switch of claim 16, wherein the third and fourth means are integrated in the single monolithic device.

18. The bidirectional switch of claim 14, wherein;

the third means, connecting the first solid state means to the control terminal, prevents the logic signal pulse from returning to the control terminal prior to the second solid state means conducting current; and the fourth means, connecting the second solid state means to the control terminal, prevents the logic signal pulse from returning to the control terminal prior to the first solid state means conducting current.

\* \* \* \* \*